(12) United States Patent
Umstadter

(10) Patent No.: US 9,268,031 B2
(45) Date of Patent: Feb. 23, 2016

(54) ADVANCED DEBRIS MITIGATION OF EUV LIGHT SOURCE

(71) Applicant: Karl R. Umstadter, Livermore, CA (US)

(72) Inventor: Karl R. Umstadter, Livermore, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 13/856,328

(22) Filed: Apr. 3, 2013

(65) Prior Publication Data

US 2013/0313423 A1    Nov. 28, 2013

Related U.S. Application Data

(60) Provisional application No. 61/621,711, filed on Apr. 9, 2012, provisional application No. 61/793,948, filed on Mar. 15, 2013.

(51) Int. Cl.
| | |
|---|---|
| *G01T 1/16* | (2006.01) |
| *H01J 49/00* | (2006.01) |
| *B08B 17/02* | (2006.01) |
| *G03F 7/20* | (2006.01) |
| *H05G 2/00* | (2006.01) |

(52) U.S. Cl.
CPC . *G01T 1/16* (2013.01); *B08B 17/02* (2013.01); *G03F 7/70033* (2013.01); *G03F 7/70916* (2013.01); *H01J 49/0031* (2013.01); *H05G 2/003* (2013.01); *H05G 2/008* (2013.01)

(58) Field of Classification Search
CPC ....... G01T 1/16; H01J 49/0031; H05G 2/001; H05G 2/003; H05G 2/008; B08B 17/02; G03F 7/70033; G03F 7/70916

USPC .................... 250/282, 395, 504 R
See application file for complete search history.

(56) References Cited

U.S. PATENT DOCUMENTS 4,408,338 A * 10/1983 Grobman ............ G03F 7/70916
378/119
5,991,360 A * 11/1999 Matsui .................. B82Y 10/00
378/119

(Continued)

FOREIGN PATENT DOCUMENTS

| RU | 109327 | 10/2010 |
| WO | 2009011579 A | 1/2009 |

OTHER PUBLICATIONS

PCT International Search Report and Written Opinion for International Application No. PCT/US2013/035651 dated Oct. 10, 2013.

(Continued)

*Primary Examiner* — Wyatt Stoffa
(74) *Attorney, Agent, or Firm* — Joshua D. Isenberg; JDI Patent

(57) ABSTRACT

Systems and methods for debris mitigation in an EUV light source for semiconductor processes are disclosed. Pulsed DC electric fields are applied to the path of EUV light to reject ions from the EUV path. The pulsed DC fields are triggered to coincide with the presence of debris in the EUV optical path. It is emphasized that this abstract is provided to comply with the rules requiring an abstract that will allow a searcher or other reader to quickly ascertain the subject matter of the technical disclosure. It is submitted with the understanding that it will not be used to interpret or limit the scope or meaning of the claims.

43 Claims, 9 Drawing Sheets

(56) References Cited

U.S. PATENT DOCUMENTS

| | | | | |
|---|---|---|---|---|
| 6,421,421 B1* | 7/2002 | McGeoch | H05G 2/003 250/251 |
| 6,614,505 B2* | 9/2003 | Koster | G03F 7/70908 355/30 |
| 6,924,600 B2* | 8/2005 | Mochizuki | G21B 1/23 315/111.21 |
| 6,998,785 B1* | 2/2006 | Silfvast | H05G 2/003 118/723 MP |
| 7,136,141 B2* | 11/2006 | Bakker | G03F 7/70941 355/30 |
| 7,196,342 B2* | 3/2007 | Ershov et al. | 250/504 R |
| 7,199,384 B2 | 4/2007 | Smith et al. | |
| 7,217,940 B2* | 5/2007 | Partlo et al. | 250/504 R |
| 7,230,258 B2* | 6/2007 | Ruzic | B82Y 10/00 156/345.48 |
| 7,271,401 B2* | 9/2007 | Imai et al. | 250/504 R |
| 7,297,968 B2* | 11/2007 | Endo et al. | 250/504 R |
| 7,605,385 B2* | 10/2009 | Bauer | 250/504 R |
| 7,652,272 B2* | 1/2010 | Ruzic | B82Y 10/00 250/504 R |
| 7,655,925 B2 | 2/2010 | Bykanov et al. | |
| 7,696,493 B2* | 4/2010 | Van Herpen | B82Y 10/00 250/492.2 |
| 7,755,070 B2 | 7/2010 | De Bruijn et al. | |
| 8,212,228 B2* | 7/2012 | Abe et al. | 250/504 R |
| 8,338,797 B2 | 12/2012 | Derra et al. | |
| 8,519,366 B2* | 8/2013 | Bykanov et al. | 250/504 R |
| 2003/0053594 A1* | 3/2003 | Fornaciari | B82Y 10/00 378/119 |
| 2005/0016679 A1* | 1/2005 | Ruzic | B82Y 10/00 156/345.5 |
| 2006/0012761 A1 | 1/2006 | Bakker et al. | |
| 2006/0138350 A1* | 6/2006 | Banine | G03F 7/70916 250/492.2 |
| 2006/0138361 A1* | 6/2006 | Van Herpen | G03F 7/70916 250/504 R |
| 2006/0138362 A1* | 6/2006 | Bakker | G03F 7/70058 250/504 R |
| 2006/0226377 A1* | 10/2006 | Hergenhan | H05G 2/006 250/493.1 |
| 2006/0243927 A1* | 11/2006 | Tran | G03F 7/70916 250/504 R |
| 2007/0007469 A1* | 1/2007 | Murakami et al. | 250/493.1 |
| 2007/0023706 A1* | 2/2007 | Sjmaenok | B82Y 10/00 250/504 R |
| 2008/0099699 A1* | 5/2008 | Yabuta | G03F 7/70033 250/504 R |
| 2008/0258085 A1* | 10/2008 | Bauer | H05G 2/001 250/504 R |
| 2009/0224181 A1* | 9/2009 | Abe et al. | 250/504 R |
| 2009/0272919 A1* | 11/2009 | Abe et al. | 250/504 R |
| 2010/0032590 A1 | 2/2010 | Bykanov et al. | |
| 2010/0078578 A1* | 4/2010 | Schuermann | G03F 7/70033 250/504 R |
| 2010/0108918 A1* | 5/2010 | Nagai | G03F 7/70033 250/504 R |
| 2010/0141909 A1* | 6/2010 | Wassink | G03F 7/70858 355/30 |
| 2010/0181498 A1* | 7/2010 | Someya | G03F 7/70033 250/492.1 |
| 2011/0024651 A1 | 2/2011 | Schimmel et al. | |
| 2011/0168925 A1* | 7/2011 | Ceglio et al. | 250/504 R |
| 2011/0188014 A1 | 8/2011 | Banine et al. | |
| 2011/0232398 A1 | 9/2011 | Lambert et al. | |
| 2011/0242516 A1 | 10/2011 | Franken et al. | |
| 2012/0119116 A1* | 5/2012 | Kakizaki | G03F 7/70033 250/504 R |
| 2012/0228527 A1* | 9/2012 | Abe | G03F 7/70033 250/504 R |

OTHER PUBLICATIONS

U.S. Appl. No. 61/621,711 to Karl Umstadter, filed Apr. 9, 2012.
U.S. Appl. No. 61/793,948, entitled "Advanced Debris Mitigation of EUV Light Source" to Karl Umstadter, filed Mar. 15, 2013.

* cited by examiner

ADVANCED DEBRIS MITIGATION OF EUV LIGHT SOURCE

PRIORITY CLAIM

This application claims the benefit of priority of U.S. provisional application No. 61/621,711 to Karl Umstadter, entitled "Advanced Debris Mitigation and Fueling of EUV Light Source", filed Apr. 9, 2012, and U.S. provisional application No. 61/793,948 to Karl Umstadter, entitled "Advanced Debris Mitigation of EUV Light Source", filed Mar. 15, 2013, the entire disclosure of which is herein incorporated by reference in its entirety.

FIELD OF THE INVENTION

This invention generally relates to EUV light sources, and more particularly to mitigating debris and fueling discharge for EUV light sources.

BACKGROUND OF THE INVENTION

With feature sizes in semiconductor technologies getting increasingly smaller, the wavelength of light has become a limiting factor in optical processes used in semiconductor processes, including lithography and wafer and mask inspection and metrology. Advanced optical technologies use EUV light (for example, wavelengths in the range of 11 nm to 15 nm and more specifically wavelengths of 13.5 nm) to address issues resulting from increasingly smaller features sizes, and a bright EUV light source free of debris is invaluable in the pursuit of next generation semiconductor processes. One challenging aspect of developing a bright EUV light source is to mitigate debris from the plasma generation process while minimizing the loss of EUV light produced by the plasma.

The generation of EUV radiation useful for these semiconductor processes involves the production of high-temperature plasma, such as laser-produced plasma (LPP), discharge-produced plasma (DPP), and laser-discharge produced plasma (LDP or laser-initiated DPP), which can emit light having the desired wavelengths for advanced optical processes. In LPP, a high energy laser is focused at a source material to ionize the source material, thereby generating high temperature plasma that emits EUV radiation. In DPP, source gas is flown through a system and high powered Z-pinch pulse compression is applied to ionize the source gas and produce high temperature plasma that emits EUV radiation. In LDP, a laser is used to initiate the conditions necessary to perform DPP generation by first vaporizing a source material. Producing plasma using the aforementioned techniques to create a useful EUV light source presents a challenge because the plasma generation process produces debris in the optical path of the EUV light, which causes damage to the EUV optics and diminishes their useful lifetime.

One way to mitigate debris is by means of pressurized gas, other than source type gas used to fuel the discharge, which is injected across the path of EUV light. For example, mitigation has been done by stationary plasma. However, gas alone is not effective on a majority of the debris emitted (ions, particles). Another method to mitigate debris is to apply a DC voltage, magnetic fields and plasma. However, steady state DC and plasma can further energize ions created in the production of EUV light. Their energies can be increased and the damage can be enhanced.

Some methods have been used to mitigate debris from EUV light sources while also providing the gas fuel to the discharge. For example, pressurized gas can be combined with quiescent feed or feed from behind the light source to fuel the plasma. Fuel gas and mitigation gas are separate. A jet is not used for fill but instead background fill that is lightly pumped is used for this purpose. However, to do this extra gas is required in the system. The extra gas reduces the EUV energy along the optical path. Furthermore gases other than the desired source gas in the source gas also degrade the emission.

For the methods discussed above, ions and particles emitted from the generated plasma have to be removed from the path by additional engineering measures that decrease the EUV light transmission. Accordingly, it would be advantageous to develop effective methods and system to achieve debris mitigation and source fueling for EUV light sources that overcome these disadvantages.

It is within this context that aspects of the present disclosure arise.

SUMMARY

In accordance with aspects of the present disclosure, a debris mitigation method includes ionizing a source material to produce plasma that emits radiation of a desired wavelength; collecting the radiation with a collector optic; generating electric field pulses in an optical path that extends from the plasma to the collector optic; and detecting radiation pulses emitted from the plasma with a photon detector, wherein said generating electric field pulses includes using the detected radiation pulses to trigger the electric field pulses.

In accordance with aspects of the present disclosure, a debris mitigation method further includes determining an ion energy distribution of debris in the optical path and correlating energy of the electric field pulses with the determined ion energy distribution; wherein said ionizing a source material includes ionizing a source gas to produce an ionized gas, and applying pulsed magnetic fields to the ionized gas to produce said plasma that emits radiation of the desired wavelength. The radiation of a desired wavelength may include extreme ultraviolet light, e.g., having a wavelength between 11 and 15 nanometers. Detecting the radiation pulses may include detecting generation of secondary electrons in a photon detector. Generating the pulsed electric fields may include applying pulsed DC bias to the photon detector.

In accordance with aspects of the present disclosure, a debris mitigation method may further include ionizing neutral particles in the optical path. Ionizing the neutral particles may include trapping electrons in the optical path with an electron trap to create an ionization field in the optical path. Determining an ion energy distribution may include detecting ions with a particle detector. Determining an ion energy distribution may include performing time of flight spectroscopy using data received from the particle detector to determine an ion energy distribution function of debris in the optical path. The particle detector may include a faraday cup or microchannel plates. The radiation of a desired wavelength may include extreme ultraviolet light having a wavelength of, e.g., 13.5 nanometers. The photon detector may include a border of the collector optic, a grid disposed in the optical path, or an annular ring disposed in the optical path.

BRIEF DESCRIPTION OF THE DRAWINGS

Other objects and advantages of the present disclosure will become apparent upon reading the following detailed description and upon reference to the accompanying drawings in which.

DETAILED DESCRIPTION

Figure 1A:
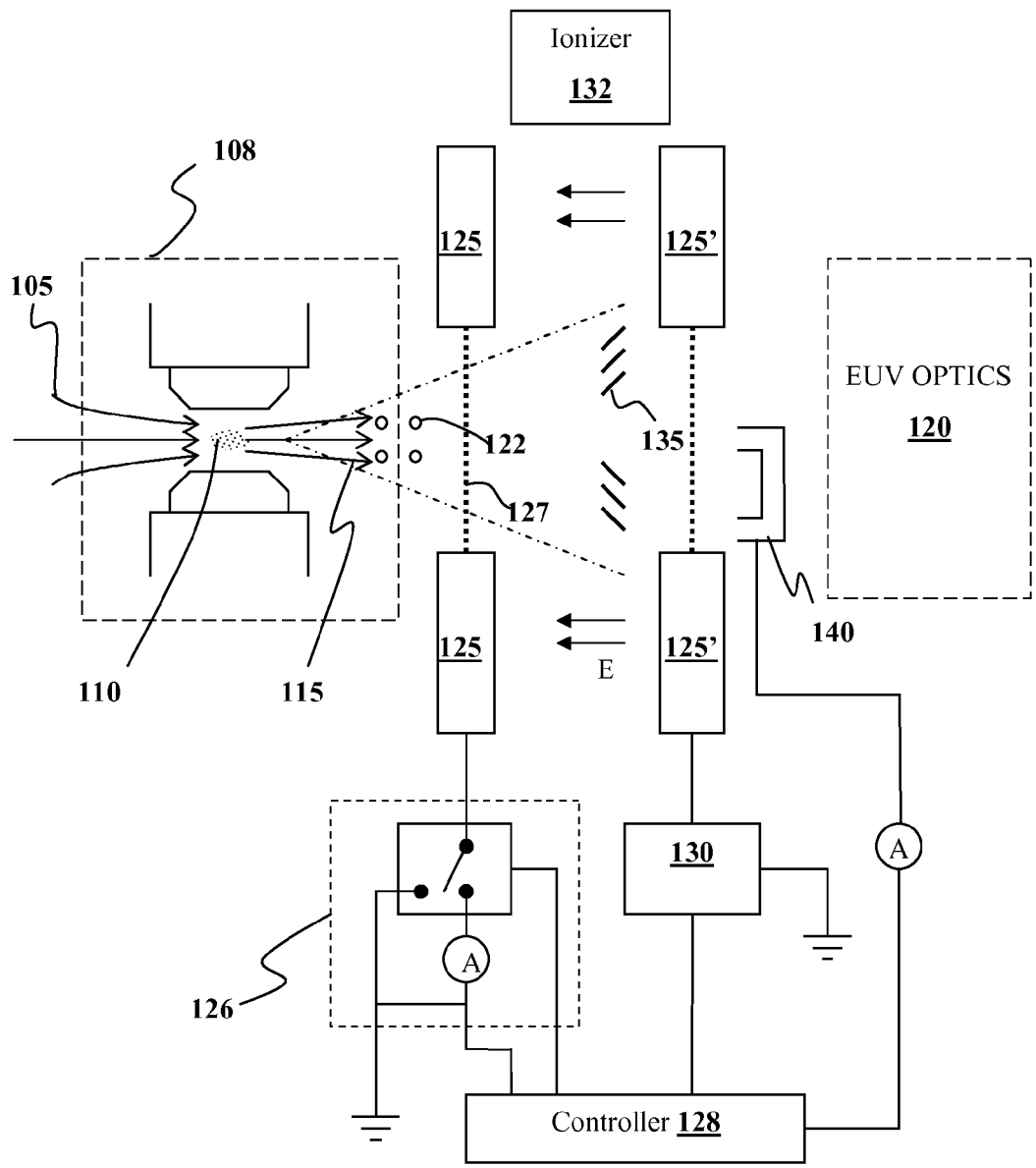
FIG. 1A depicts a debris mitigation system for an EUV light source using DPP, according to aspects of the present disclosure.

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Additionally, because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention.

In this document, the terms "a" and "an" are used, as is common in patent documents, to include one or more than one. In this document, the term "or" is used to refer to a nonexclusive "or," such that "A or B" includes "A but not B," "B but not A," and "A and B," unless otherwise indicated. The following detailed description, therefore, is not to be taken in a limiting sense, and the scope of the present invention is defined by the appended claims.

As used herein, the term "light" generally refers to electromagnetic radiation characterized by a frequency somewhere in a range of frequencies miming from the infrared through the ultraviolet, roughly corresponding to a range of vacuum wavelengths from about 1 nanometer ($10^{-9}$ meters) to about 100 microns.

As used herein, the term extreme ultraviolet (EUV) generally refers high-energy electromagnetic radiation, in the part of the electromagnetic spectrum spanning vacuum wavelengths from about 124 nm down to about 5 nm, and therefore (by the Planck—Einstein equation) having photons with energies from about 10 electron volts (eV) up to 248 eV (corresponding to 124 nanometers (nm) to 10 nm respectively).

Aspects of the present disclosure are directed to mitigating damage due to debris in the optical path of a plasma produced light source, particularly EUV light generated by laser-produced plasma and discharge-produced plasma used in next generation semiconductor fabrication and inspection processes, including wafer and mask inspection, metrology, and lithography. Electric fields are generated to reject debris in the beam path by deflecting ions before they contaminate the optics. While electric fields can be created by applying a steady state DC bias to the system, applying a constant steady state voltage causes Paschen breakdown of gases in the EUV chamber, generates excessive heat load, and further energizes ions in the optical path, thereby causing further problems and enhancing the damage. Aspects of the present disclosure include utilizing pulsed DC bias to time electric field pulses to coincide with particular species of debris to be deflected, while minimizing or eliminating collateral damage that would be caused by a creating a steady state electric field.

Aspects of the present disclosure include triggering electric field pulses to coincide with the presence of debris in the EUV optical path. Voltages which create the electric field pulses are pulsed for a short enough period of time to avoid problems associated with application of a steady state electric fields to the system, including the Paschen breakdown of gases in the EUV chamber.

Aspects of the present disclosure include utilizing photons emitted from the plasma as a trigger for the voltage pulses that create electric fields for rejecting ions in the optical path. Photons and electrons travel faster than ions in the optical path, and the generation of photons (e.g., EUV photons) coincides with the generation of harmful debris (e.g., ions) in the plasma production process, thereby enabling the presence of photons to be used as a trigger for the electric field pulses that deflect ions before they reach collector optics. Utilizing light itself that is emitted from the plasma also overcomes problems associated with detecting particles in the optical path due to photon flux in the system.

Aspects of the present disclosure include a structure in the EUV beam path that is used as a photon detector to trigger the pulsed DC fields. When high energy photons emitted from the plasma strike the photon detector, secondary electrons are generated which are detected by the resulting current draw and can be used to trip a circuit that triggers the voltage.

Aspects of the present disclosure include a photon detector that can be a dedicated photon detector structure or a structure that is already in the system. Any photosensor or any structure that generates secondary electrons upon incidence of radiation emitted from the plasma can be used as a photon detector to trigger the voltage pulses, and the photon detector should be selected or designed so that the transmission of useful radiation to the EUV optics is maximized.

Aspects of the present disclosure include characterizing the beam to determine the ion energy distribution of particles in the optical path. The energy of the pulsed rejector fields are correlated with the energy distribution of debris in order to generate sufficient electric fields in the optical path of EUV light to reject the ions of interest in the debris.

Aspects of the present disclosure include particle detectors that obtain data used to characterize ion energies in the beam so that the ion energy distribution function of the debris can be determined. The particle detectors are disposed in a path of light emitted from the plasma to characterize the beam, and time of flight (TOF) spectroscopy is used to determine velocities of ions in the beam path based on data received from the particle detectors. Coupled with known information about materials in the system, this data is used to obtain the IEDF of the debris, which is used to correlate the pulsed voltages to the particular ions to be rejected in the optical path.

In FIG. 1A, depicts an example of debris mitigation for an EUV system 100. By way of example light may be generated from a discharge-produced plasma (DPP) source. However, aspects of the present disclosure are not limited to such implementations. Source material 105 is flown through a discharge source 108 and ionized to produce high temperature plasma 110. EUV optics 120 may collect the EUV radiation 115.

As noted above, in some implementations, the discharge source 108 may be a discharge produced plasma (DPP) source. In such an implementation, a source material 105, e.g., a noble gas such as Xenon, may be ionized with low energy to produce an ionized gas or seed plasma. High powered Z-pinch pulse compression with magnetic fields may be applied to the ionized gas to generate discharge of the source material 105, thereby further ionizing the seed plasma to produce high temperature plasma 110 that emits the EUV radiation 115.

The EUV optics 120 may include various types of optical elements to redirect useful EUV light 115. For example, the optics 120 can include direct incidence multi-layered mirrors or grazing incidence mirrors, although it is noted that aspects of the present disclosure have particular applicability to direct incidence multi-layered mirrors because the angle of incidence of EUV light 115 and debris 122 results in increased momentum of debris 122, which causes more damage to the optics 120 as compared to grazing incidence mirrors.

Depending on the nature of the EUV system 100, the EUV radiation may be used for photolithography or inspection. Other EUV applications are also possible. In the case of EUV lithography, the optics 120 may focus the EUV radiation 115 through a lithography mask to image a pattern onto a substrate covered with an EUV sensitive resist. In the case of an inspection system, the optics 120 may focus the EUV radiation 115 onto a target and collect a portion the EUV radiation that is scattered from the target.

In some implementations, the conditions necessary to generate high temperature plasma 110 via electric discharge of the ionized gas in discharge system 108 may be initiated with a laser (i.e. LDP), such as by vaporizing Tin (Sn) with a laser, which produces the seed plasma or ionized gas that can be used in the discharge system 108.

Ionizing source material 105 in the discharge system 108 creates high temperature plasma 110 that emits EUV radiation 115, which is transmitted to collector optic 120 that collects the light 115 for use in a subsequent semiconductor process. The plasma generation process also generates a substantial amount of debris 122, which may include ions or charged clusters that can contaminate the EUV optics 120 and significantly reduce its useful lifetime. The EUV system 100 may be configured to implement debris mitigation that uses a triggered pulsed DC bias to generate pulsed electric fields that reject ions in the beam path and minimize contamination of EUV the optics 120 by debris 122.

According to aspects of the present disclosure, the EUV radiation 115 may be detected by a suitably configured detector. By way of example and not by way of limitation, the EUV radiation may be incident upon a structure 125 within the system 100, which absorbs a portion of the radiation and emits secondary electrons. The remainder of the EUV light 115 may be transmitted to the optics 120. If the structure 125 is electrically conductive, the emitted secondary electrons may be detected by a detector circuit 126 as an electrical current. Electrons, ions, or other electrically charged debris may also strike the structure 125 and may be similarly detected by the detector circuit 126. The detector circuit may be coupled to a controller 128 and the controller may be coupled to a high voltage power supply 130. The functions of the controller 128 may be a general purpose computer or may be implemented as specialized hardware or firmware. The high voltage power supply 130 may be selectively coupled to a structure 125' in the system 100 in response to control signals from the controller 128. The structure 125' may be located between the discharge system 108 and the optics 120. In the example illustrated in FIG. 1A, the structure 125' to which the power supply 130 is coupled is different from the structure 125 to which the detector circuit 126 is coupled. However, in alternative implementations it is possible to selectively couple both the detector circuit 126 and the power supply 130 to the same structure.

The controller 128 is configured to trigger the power supply 130 to apply a pulse of voltage to the structure 125' thereby generating a pulsed electric field E that repels the debris 122. In the example depicted in FIG. 1A, the voltage may be a positive voltage so that the field E repels positively charged debris. Alternatively, the voltage may be a negative voltage so that the field E repels negatively charged debris.

By way of example, and not by way of limitation, the structure 125 or 125' may be an aperture within the system, e.g., a differential pumping aperture or an optical aperture. In some implementations, the collection of EUV radiation and generation of secondary electrons may be enhanced if an electrically conductive grid 127 is disposed across the aperture. Current draw resulting from the generation of secondary electrons is used detect photons of EUV 115 (or other high energy photons). The generation of EUV light 115 may generally coincide with generation of the debris 122 in the EUV optical path, as both may be generated in the plasma generation process. Consequently, the controller may use detection of EUV photons, electrons, ions or other charged particles striking the structure 125 to trigger high voltage pulses to deflect ions before they reach optics 120. Because photons 115 and electrons in the optical path travel faster than harmful debris 122, they reach the photon detector 125 before the debris 122. The detection of photons or current draw in the detector 125 may therefore be used as a trigger for the pulsed DC fields to steer harmful debris 122 away before they can contaminate the optics 120.

It is noted that the structures 125, 125' may take various forms other than those depicted in FIG. 1A. For example, in some implementations, the structure may be an annular ring that extends around a periphery of the emitted EUV beam path, so that substantially all useful EUV light is transmitted through its center, and the structure 125 collects only peripheral portions of the EUV beam which would have otherwise not have been collected by the optics 120. If the structure 125 is an annular ring, its diameter may be proportionally smaller if it is disposed closer to the light source (i.e., based on etendue of emitted light). In some implementations, a structure of an existing part of the EUV system 100 may be adapted to act as part of the detector. By way of example, and not by way of limitation, an electrically conductive diaphragm or other structure at a peripheral border of the collection optics 120 may be used as a collection plate for the detector. In some embodiments, the detector may be a differential pumping aperture (DPA) of the gas discharge system 108. In some embodiments, the structure 125 may include a plurality of small plates.

The pulsed DC bias that creates the pulsed electric field can be applied at various locations in the EUV beam path that extends from the plasma 110 to the collector optic 120. For example, pulsed DC bias from the power supply 130 may be applied to the detector structure 125 itself, such that current draws by the detector circuit 126 caused by the incidence of photons 115 trips triggers a pulsed DC voltage. By way of example, the structure 125 may be biased slightly negative so that the generation of secondary electrons results in a current draw that triggers the power supply 130 to deflect positive ions before they reach the optics 120. It is noted that ions generated in the plasma production process tend to be positively charged, such as with DPP using Xenon gas, so a positive bias in the system is effective at mitigating the debris.

The system 100 may optionally include a low energy ionizer 132 to ionize neutral particles in the debris 122. Particularly in discharge-produced plasma sources, a significant number of neutral particles which would otherwise be unaffected by the pulsed DC fields are generated in the plasma production process. By way of example, and not by way of limitation, the ionizer 132 may be an electron trap, e.g., a hollow cathode emitter. The ionizer 132 may use electrons generated in the discharge system 108 to generate an ionization field in the EUV optical path. The ionization field generated by ionizer 130 charges neutral particles in debris 122 and enables their deflection via the pulsed electric field E.

The system 100 may also optionally include vanes 135 located in the EUV optical path to further mitigate damage due to debris 122 by trapping low energy particles, thereby further removing debris 122 from the optical path.

The magnitude and timing of the pulsed DC fields should be sufficient to effectively deflect ions in the beam path and mitigate the damage to optics 120 due to debris 122, but the magnitude and time period at which they are applied is limited to avoid the problems with applying electric fields to the system. Accordingly, the energy of the applied pulsed DC fields used to mitigate debris 122 is correlated to the energies of ions in the path of EUV radiation 115.

Figure 1B:
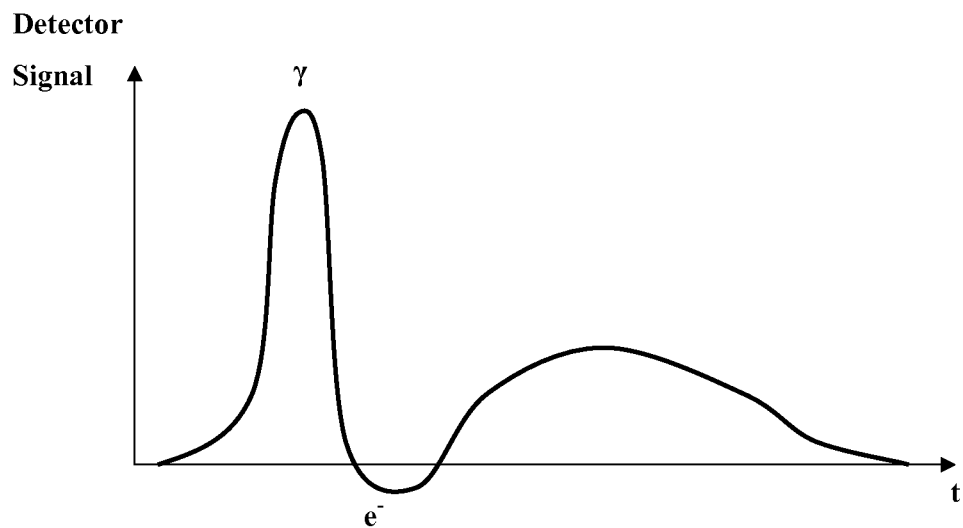
FIG. 1B is a graph of collector signal versus time illustrating how time of flight spectroscopy may be used in accordance with certain aspects of the present disclosure.
Figure 1C:
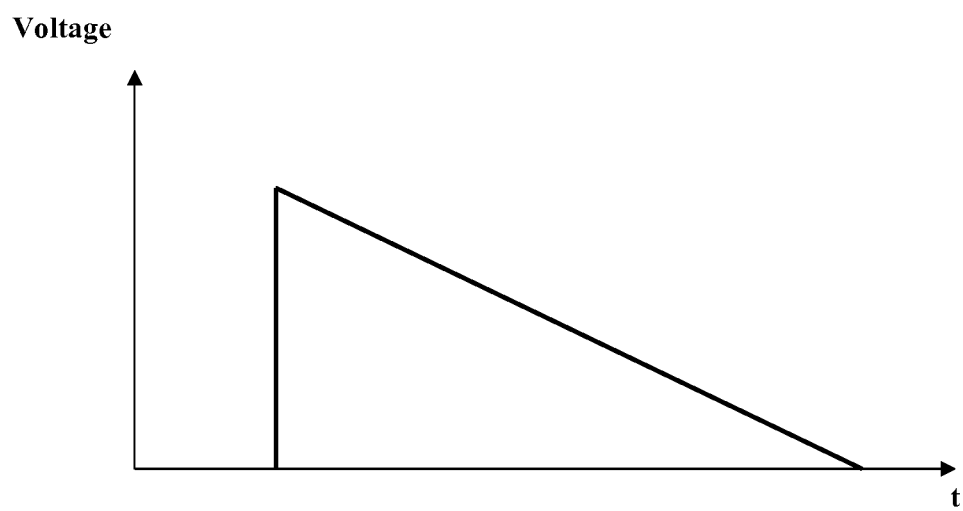
FIG. 1C is a pulsed voltage waveform that may be used in accordance with certain aspects of the present disclosure.

The system 100 may optionally include one or more particle detectors 140 that may be used to detect the EUV beam and determining the ion energy distribution function (IEDF) of the beam, so that the voltage provide by the power supply 130 to apply of the pulsed DC fields can be correlated with the energy of ions or other charged particles in the beam path. Data from the one or more particle detectors 140 is used to perform time of flight (TOF) spectroscopy to determine velocities of the ions in the beam as illustrated in FIG. 1B. Velocities may be determined e.g., by dividing a known distance between the discharge source 108 and the detector 140 by a time of flight, which can be determined from data of the type shown in FIG. 1B. Specifically, as seen in the graph, a narrow positive peak in the detector signal indicated by γ may be due to photons from the discharge source. A slight negative indicated by e⁻ may be attributed to electrons. A second broader positive peak may be attributed to ions. The faster ions are at the left-hand portion of this peak. Velocities obtained from TOF coupled with knowledge of materials in the system are used to obtain the IEDF of the beam, which may then be used to determine a waveform of the pulsed DC bias in the system, thereby limiting the applied voltage only to what is sufficient for effectively deflecting ions and mitigating damage to the optics 120 due to debris 122. In order to correlate the pulsed DC voltage from the power supply 130 with the ion energies of the debris, pulsed DC bias may applied in the form of a voltage waveform having a magnitude as a function of time that is correlated to the IEDF of debris, wherein each pulse (i.e. each wave) is triggered by the detection of photons emitted from the plasma 110. By way of example, and not by way of limitation, the pulsed voltage may be in the form of a sawtooth waveform, as depicted in FIG. 1C. The voltage waveform may have a voltage that is higher initially to coincide with a high initial ion energy of the IEDF, wherein the higher voltage is needed to deflect higher energies of ions that are initially present with each EUV pulse In certain implementations, the one or more particle detectors 140 may be located far from the plasma discharge source 108 as this improves the resolution of the device for determining the IEDF. In some embodiments, one or more particle detectors 140 include a faraday cups or microchannel plates for obtaining data which is used to determine the IEDF. In some embodiments, one or more particle detectors 140 may be disposed approximately 1.5 meters away from the source of plasma generation to provide ideal resolution for determination of the IEDF. The detectors 140 may also be used to verify that the pulsed DC bias is deflecting the debris. In in such implementations, the system 100 may be configured to intentionally permit ions to reach the optic (for example, skip every thousandth pulse) in order to diagnose the system and ensure that the pulsed electric fields are effective at mitigating debris. In particular, a detector signal measured by the particle detector(s) 140 with the pulsed bias off may be compared with a detector signal measured with the pulsed bias on. The timing and/or waveform of the voltage pulses may be adjusted until detector signal measured with the bias on is minimized.

Figure 2:
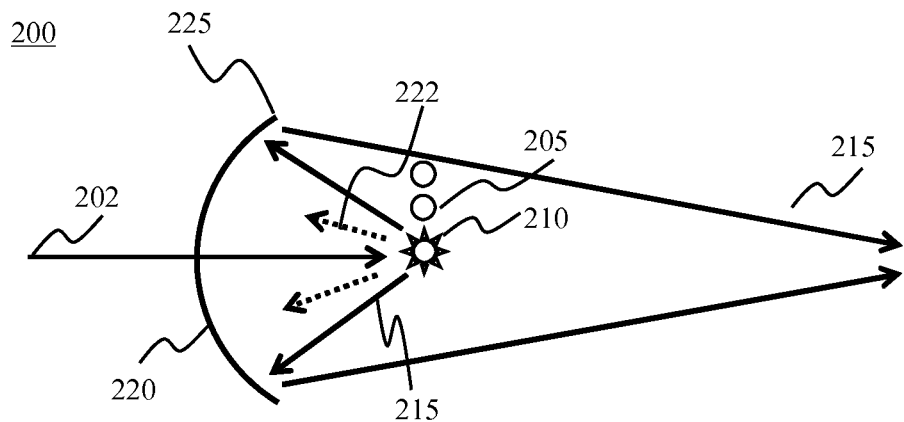
FIG. 2 depicts an LPP light source that may be used in conjunction with debris mitigation according to aspects of the present disclosure.

In certain alternative implementations, the discharge source 108 may be laser produced plasma (LPP) source. The operation of an LPP source 200 may be understood with reference to FIG. 2. A pulse of high intensity light 202 from a pulsed laser may be focused onto a small point of source material 205 to ionize the material and produce high temperature plasma 210. The high temperature plasma 210 emits EUV radiation 215, which may be collected and focused by EUV optics 220 for use in a subsequent semiconductor process. In some implementations, the source material 205 may include droplets of Lithium (Li), Tin (Sn), or Xenon (Xe) or Nitrogen ($N_2$). The source material 205 may be heated by the light pulse 202 to different plasma temperatures depending on the wavelength of light desired for the particular application. The LPP generation process may also generate debris 222 in the optical path of EUV radiation 215, which can contaminate the EUV optics 220. Such debris may be mitigated using pulsed DC bias as discussed above.

Figure 3:
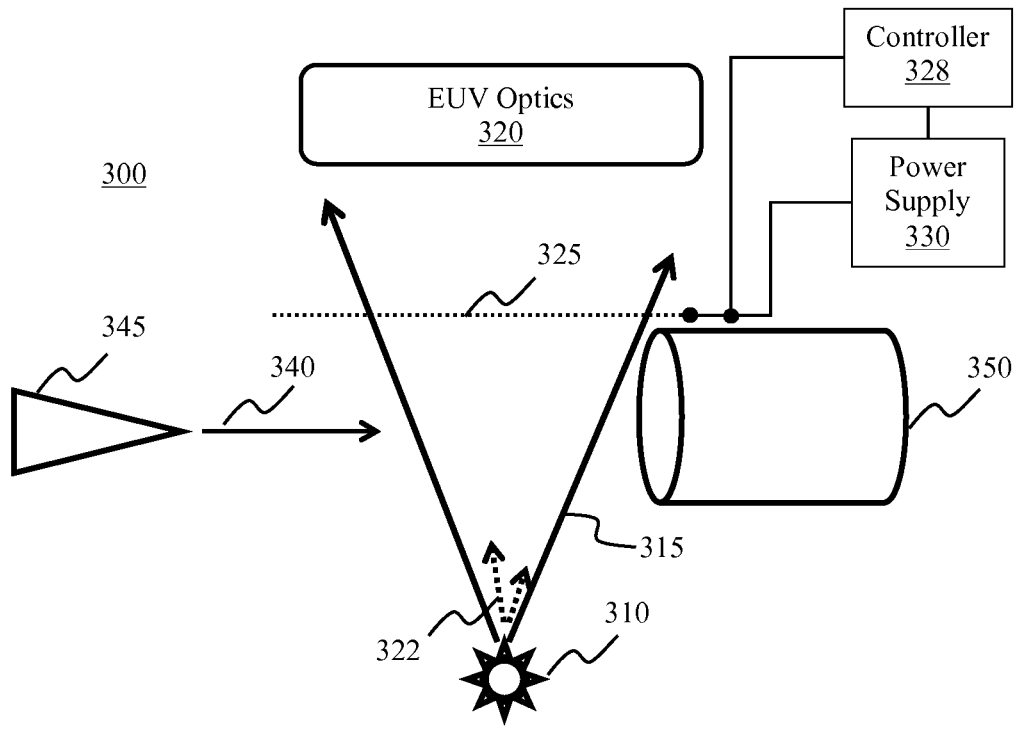
FIG. 3 depicts a debris mitigation system for an EUV light source using pressurized gas in combination with pulsed electric fields, according to aspects of the present disclosure.

According to aspects of the present disclosure, debris mitigation using pulsed DC bias may be combined with other forms of debris mitigation. For example, as shown in FIG. 3, a debris mitigation system 300 may combine a pulsed DC bias with a gas jet. The debris mitigation system 300 may be incorporated into the EUV system 100 of FIG. 1A. In the debris mitigation system 300 EUV light 315 from a discharge 310 may be used to trigger pulsed DC bias. The DC pulse may be applied to a grid 325 located between the discharge 310 and EUV optics 320 to deflect debris 322 from the discharge 310. A power supply 330 may provide the DC pulsed bias in response to a signal from a controller 328, e.g., as discussed above.

A gas nozzle 345 may integrated as part of the system 300 to blow pressurized gas 342 across the path of the EUV light 315 to facilitate debris mitigation. The nozzle 345 may inject the pressurized gas 342 at high speeds across the path of EUV light 315 to deflect the debris 322 from the optical path into tube 350, or otherwise away from the optics 320. The EUV light 315 may also pass through the grid 325, which can act as a photon detector to trigger the pulsed DC bias that generates electric fields for deflecting ions in the debris 322. The grid 325 maybe a mesh that is highly transmissive to EUV light 315 (e.g., about 99% transmissive) so that the amount of useful radiation that passed through to the optics 320 may be maximized.

Aspects of the present disclosure include controlling the debris mitigation system using a computer or other processing system that is configured via suitable programming to apply the appropriate voltages based on data received from the system.

In some embodiments, the pulsed DC bias is a positive bias because ions in the debris tend to be positive, as source materials used, such as Xenon gas, do not tend to produce negative ion contaminants in the debris. The photon detector can be biased slightly negative, such that current draw resulting from the generation of secondary electrons trips a circuit to generate a positive bias in the system to reject positive ions.

In some embodiments, the pulse waveform is modified to act as a selective ion rejector, in which particular ions are intentionally permitted to pass through the system and sputter clean the optics.

In some embodiments, data received from particle detectors are used to provide real-time diagnostic feedback, which can be used to adjust the pulse waveform of the triggered rejector if needed. Data received from one or more particle detectors located at the plasma light source is compared with data received from one or more particle detectors located at the optic to diagnose if the triggered rejector is effective at deflecting debris.

In some embodiments, where conditions are highly dynamic, the rejector fields are adjusted from pulse-to-pulse based on diagnostic data received from the particle detectors.

Additional Aspects

Figure 4A:
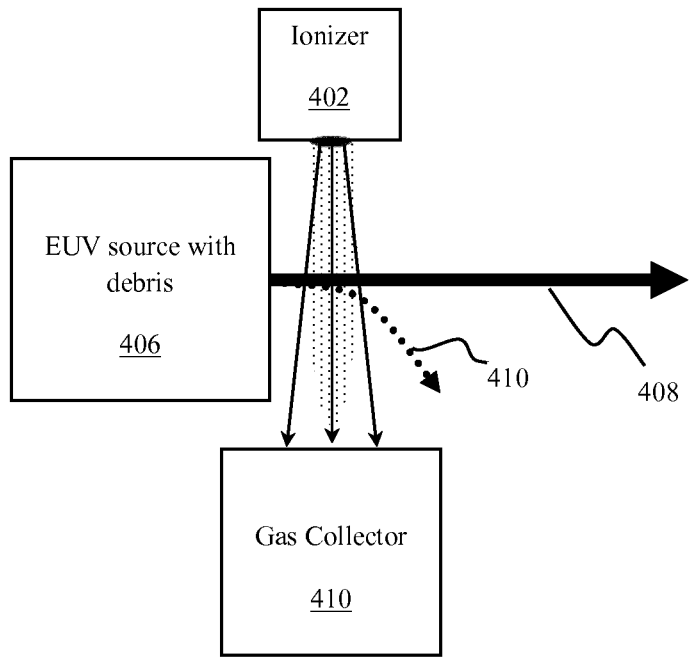
FIGS. 4A-4B are schematic diagrams illustrating use of ionized plasma for debris mitigation in accordance with alternative aspects of the present disclosure.
Figure 4B:
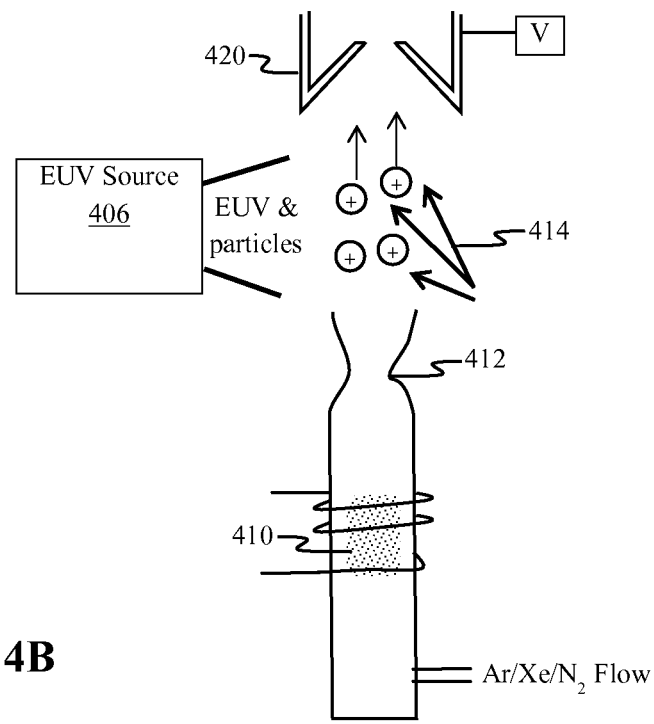

According to an additional aspect of the present disclosure, a jet composed of partially/fully ionized plasma may directed from an orifice across the EUV light path. As shown in FIGS. 4A-4B, an ionizer 402 may create a partially ionized plasma and jet 404 that contains energetic ions. The energetic ions and electrons may interact with the debris created in an EUV source 406 redirect the debris out of the EUV light path 408. Gas from the jet may be collected by a gas collector 410.

As shown in FIG. 4B positive or negative ions may be extracted from an inductively coupled plasma (ICP) 410 by an extraction grid cathode 420 opposite the ICP source. The ICP source may include a de Laval nozzle 412 or similar structure to increase the velocity of gas or ions. The plasma can be formed from an inert gas, e.g., Argon, Xenon, or Nitrogen ($N_2$). If the plasma is much hotter than the debris particles, the plasma can push the debris out of the EUV optical path. In some implementations, the plasma may generate negative ions to repel negatively charged debris (e.g., dust, which tends to be negatively charged). A laser may be used to preferentially heat or ionize particles from one side with laser light 414. The ionization can promote electric field for extracting the ions from the plasma.

Figure 5:
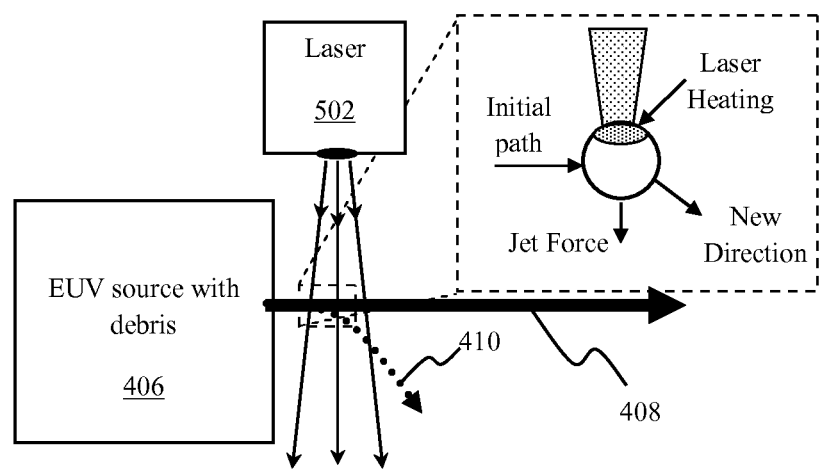
FIG. 5 is a schematic diagram illustrating use of a laser for preferential heating of debris from one side in accordance with certain aspects of the present disclosure.
Figure 6A:
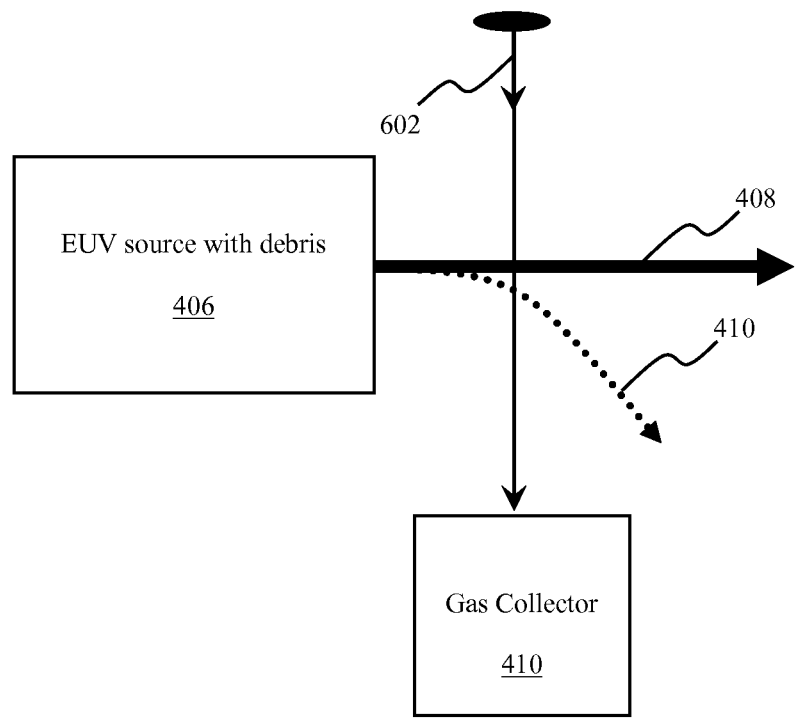
FIGS. 6A-6B are schematic diagrams illustrating use of a liquid helium jet for debris mitigation in accordance with certain aspects of the present disclosure.
Figure 6B:
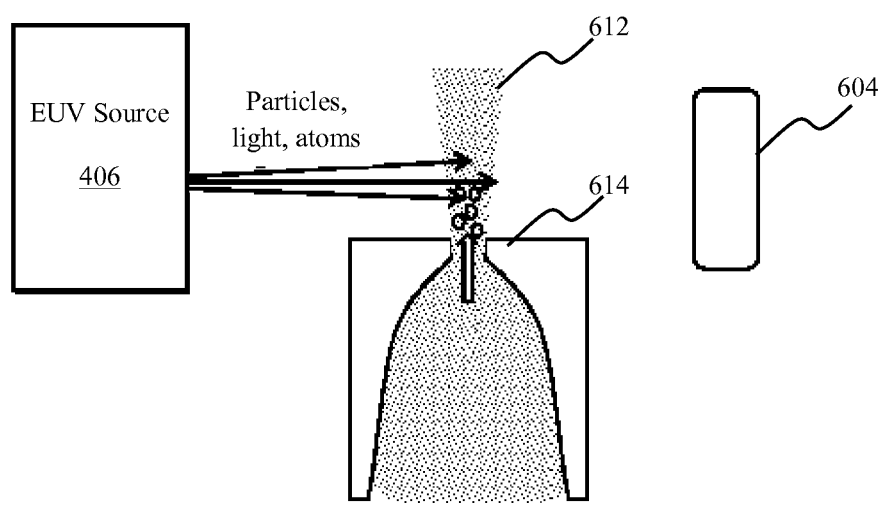

Additionally, a laser can be used to preferentially heat one side of the debris and drive it away as illustrated in FIG. 5. Also, a liquid helium jet or liquid helium clusters can be used to block debris as shown in FIGS. 6A-6B. In particular, as shown in FIG. 6A, a thin helium sheet 602 may be flown across an EUV light path 408 from an EUV source 406 to deflect a path 410 of gas and debris from the source 406. Alternatively, as shown in FIG. 6B, in liquid helium debris mitigation, a jet 612 of liquid helium droplets and gas at a temperature of less than about 20 Kelvin may be streamed or pulsed into vacuum across a cold orifice 614 for the purpose of deflecting or entraining gas and particles traveling through the stream from an EUV source 406. The jet 612 deflects the gas and particles away from EUV optics 604. Helium absorbs much less EUV than other gases and clusters can mitigate particles better as they are larger.

These features may be pulsed or continuous. Alternatively, many small jets can be used near the entrance to the bore. Jets can also be made into an annulus (ring). Aspects of the present disclosure provide improvements over conventional methods. Prior gas mitigation does not remove a significant fraction of the debris from the EUV light path. When gas pressure is increased, the fraction of EUV light emitted is reduced. In the proposed methods, additional mitigation is possible without the loss of EUV light. Additionally, the transmission of EUV light may be increased.

As discussed above, according to another aspect of the present disclosure, a pulsed DC bias may be applied to various locations along the beam path according to the species of interest to be rejected in conjunction with debris mitigation using ionized plasma, preferential laser heating, or liquid helium. Triggering different debris mitigation techniques to coincide with the specific species to reject will eliminate collateral damage caused by previous methods. EUV photos, in addition to electrons created in the pinch travel faster than ions and other debris. When photons and electrons interact with objects in the beam path, their signature can be used to trigger the appropriate type of debris mitigation technique, Ions and electrons created in the pinch do not have their energies increased, thereby decreasing the damage they can cause. Furthermore, correct timing of debris mitigation techniques quill reduce or eliminate damage caused by these species altogether. Alternatively, grids or small plates may be used to detect electrons or secondary electrons. Photodetectors can be used to detect photons. Current probes can be used to detect the flow and magnitude of ions and electrons.

Figure 7A:
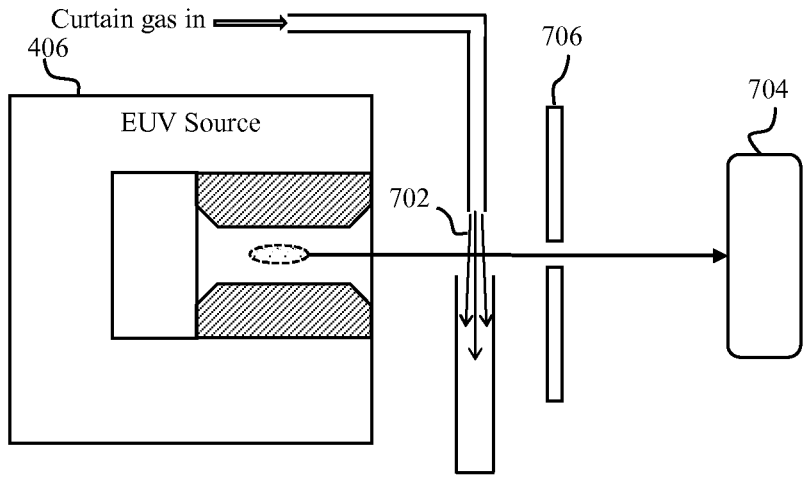
FIGS. 7A-7C are schematic diagrams illustrating use of a gas curtain for debris mitigation in accordance with certain aspects of the present disclosure.
Figure 7B:
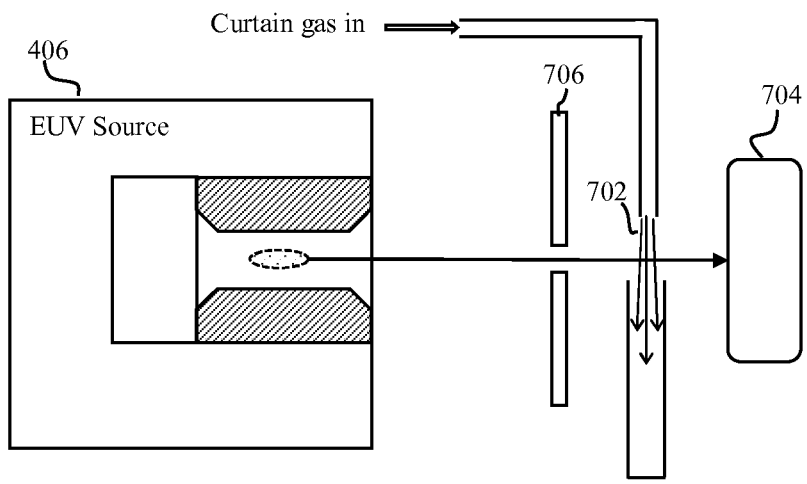
Figure 7C:
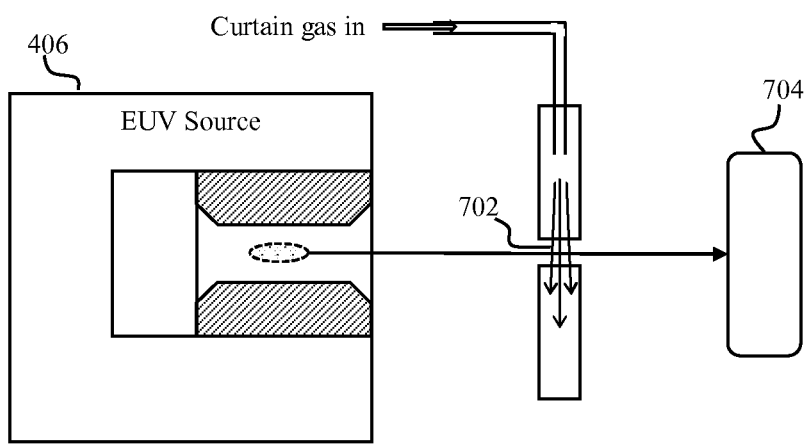

According to yet another aspect of the invention, the differential pumping aperture (DPA) of an EUV source 108 may be replaced by a gas curtain system as shown in FIGS. 7A-7C in order to simultaneously mitigate debris and supply a fuel source. According to this aspect, a gas curtain 702 may be positioned between the EUV source 406 and EUV optics 704. Three different locations for the gas curtain 702 are illustrated. In FIG. 7A, the gas curtain 702 is between the EUV source 406 and the DPA 706. In FIG. 7B, the gas curtain is between the DPA and the EUV optics. In FIG. 7C the gas curtain replaces or is incorporated into the DPA between the EUV source 406 and EUV optics 704.

By way of example, and not by way of limitation, in FIGS. 7A-7C, a jet composed of Xenon (Xe) gas may be shot across an optical aperture of a DPP source. Xe can provide more significant deflection of debris due to its relatively large mass. Normal leakage from the curtain can be used as fuel on the source side. The nozzle and collector of this gas curtain are mostly enclosed in a tube and are designed such that a small amount of Xe leaks to both the source and chamber regions. The Xe pressure in the main chamber is reduced by large pumping on this chamber. The source pressure is maintained at a desirable level by throttling the pump speed in this region. $H_2$ may be sued as the jet and additional Xe may be added to the source area. The high pressure of $H_2$ prevents Xe from exiting the source region. The result is a debris curtain and greatly reduced Xe gas in the optical pathway. Pumping in the source region provides constant flow of gas. This design enables Xe gas being used for fueling and mitigation without additional loss of EUVB light. Alternative, the gas can be ionized to provide additional mitigation and DPA properties. The DPA can also be biased to repel ions and electrons. It is noted that other gases may be used, e.g., mixtures of $H_2$ and Xe that vary from nearly pure Xe to pure $H_2$. Also Argon (Ar) may be used instead of $H_2$.

Figure 8:
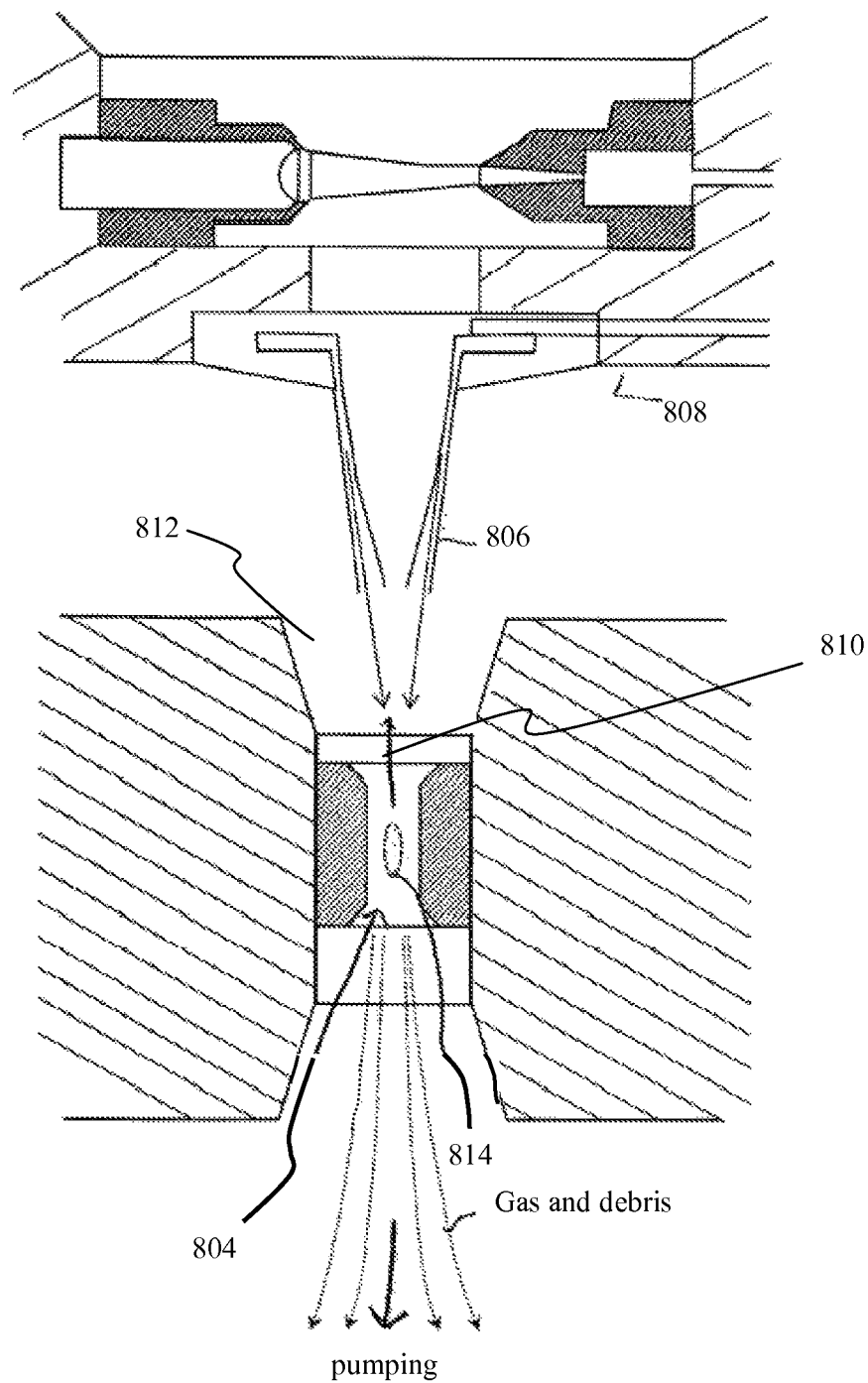
FIG. 8 is a schematic diagram illustrating use of a gas nozzle at an entrance aperture to EUV optics according to certain aspects of the present disclosure.

According to yet another aspect of the present disclosure, a gas jet may be directed from an annular gas jet nozzle towards the bore of the DPP source. The gas jet may be used to fuel a DPP or for debris mitigation or a combination of both. As shown in FIG. 8, the bore 804 of a DPP source 812 may be pumped from behind to remove the gas rapidly and maintain the desired pressure at the DPP pinch 814. The annular gas jet nozzle 806 can also serve as the differential pumping aperture (DPA) separating high from low pressure regions. The annular nozzle 806 surrounds a EUV optics aperture 808. In conventional methods, by contrast, gas mitigation directs debris only 90 degrees from the path and additional measures are required. Separate mitigation gas and additional measures decrease the EUV light 810 emitted from the DPP system 812. Fuel gas is typically fed into the DPP pinch 814 to sustain the pulsed discharge. According to aspects of the present disclosure, fuel gas may also be used to mitigate debris from the DPP 814 and direct debris 180 degrees from the desired EUV path.

Figure 9:
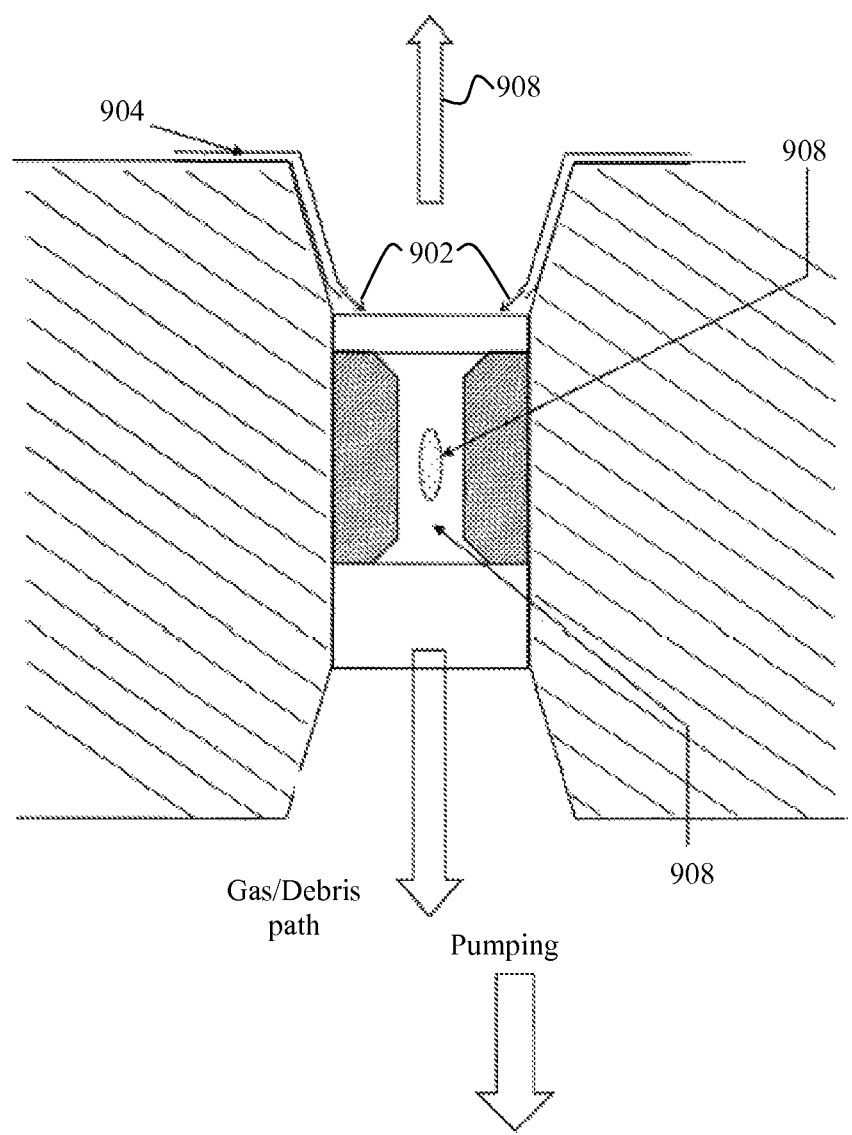
FIG. 9 is a schematic diagram illustrating use of a gas nozzle at a differential pumping aperture according to certain aspects of the present disclosure.

Alternatively, many small jets can be used near the entrance to the bore pointing backwards as illustrated in FIG. 9. Jets 902, e.g., including a single annular jet from an annular nozzle 904 can be moved closer to the bore 906 to minimize the region of fueling pressure. The smaller the volume of Xe that EUV light 908 passes through, the brighter (more photons) the source is. Movement of the fuel source alone to the bore 906 will provide benefits. Aspects of the present disclosure also reduce the region of high pressure between the DPP 910 and the optics downstream.

While aspects of the present disclosure have been explained with reference to the production of plasma to generate EUV radiation, aspects of the present disclosure have applicability generally to the deflection of ions in a plasma produced light source that emits light of a desired wavelength.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for".

What is claimed is:

1. A method, comprising directing an ionized plasma jet from an orifice across an EUV light path external to an EUV discharge system thereby redirecting debris out of the EUV light path, wherein directing an ionized plasma jet is triggered to coincide with specific debris to be mitigated when a photon or particle detector detects emission of radiation or charged particles from the EUV discharge system.

2. A method, comprising using a laser to preferentially heat one side of debris thereby directing the debris out of an EUV light path external to an EUV discharge system, wherein using a laser is triggered to coincide with specific debris to be mitigated when a photon or particle detector detects emission of radiation or charged particles from the EUV discharge system.

3. A method, comprising directing a liquid helium jet or liquid helium clusters across an EUV light path external to an EUV discharge system to block debris from entering the light path, wherein directing a liquid helium jet or liquid helium cluster is triggered to coincide with specific debris to be mitigated when a detector detects emission of radiation or charged particles from the EUV discharge system.

4. The method of claim 1, 2, or 3 wherein the jet or laser is pulsed or continuous.

5. The method of claim 1 or 3 wherein more than one small jet is used near a bore entrance.

6. The method of claim 5, wherein the more than one small jet is made into an annulus.

7. A method for mitigating debris for an EUV discharge system, comprising applying a pulsed DC bias to one or more locations external to the EUV light source along an EUV light path to coincide with specific debris to be mitigated when a photon or particle detector detects emission of radiation or charged particles from the EUV discharge system.

8. The method of claim 7, further comprising using one or more detectors to detect photons or electrons in real-time in the light path and to use detection of the photons or electrons to trigger application of the pulsed DC bias.

9. The method of claim 8, wherein the detectors are grids, small plates, photodetectors, or current probes.

10. A method for mitigating debris and providing fuel for a discharge in an EUV light source, comprising using a combination of a differential pumping aperture (DPA) and a gas curtain, wherein the gas curtain is directed across an EUV light path of the EUV light source and wherein the gas curtain is positioned external to the EUV light source between the EUV source and EUV optics and wherein the EUV light source and the EUV optics are configured so that light emitted from the EUV light source passes through the DPA to the EUV optics, wherein the gas curtain is a jet composed of Xenon gas that is directed across an optical aperture of a discharge produced plasma (DPP) source.

11. The method of claim 10, wherein the gas curtain includes a nozzle and a collector, both of which are mostly enclosed in a tube.

12. The method of claim 11, wherein a small amount of Xenon gas from the tube leaks to both a DPP source region and a main chamber region.

13. The method of claim 12, wherein the Xenon pressure in the main chamber is reduced by large pumping on the main chamber.

14. The method of claim 13, wherein the DPP source region pressure is maintained at a desirable level by throttling a pump speed in the DPP source region.

15. The method of claim 10 wherein the gas curtain is ionized to provide additional mitigation and DPA properties.

16. The method of claim 10, wherein the DPA is biased to repel ions and electrons.

17. A method of mitigating debris and providing discharge fuel for an EUV light source, comprising directing a gas jet from an annulus towards a bore of a discharge produced plasma (DPP) source, while pumping the bore from behind to remove the gas rapidly and maintain a desired pressure at a DPP pinch, wherein debris is deflected in a direction opposite to a desired path through the bore of EUV light from the EUV light source.

18. The method of claim 17, wherein the annulus serves as a differential pumping aperture (DPA) separating high from low pressure regions.

19. The method of claim 17, wherein more than one small jet is used near an entrance to the bore pointing towards the bore.

20. The method of claim 19, wherein jets including a single annular jet is moved closer to the bore to minimize the region of fueling pressure.

21. An apparatus, comprising an ionizer configured to direct an ionized plasma jet from an orifice across an EUV light path external to an EUV discharge system thereby redirecting debris out of the EUV light path; and
a controller configured to trigger the ionizer direct the ionized plasma jet to coincide with specific debris to be mitigated when a photon or particle detector detects emission of radiation or charged particles from the EUV discharge system.

22. The apparatus of claim 21, wherein the ionized plasma jet is a pulsed ionized plasma jet.

23. The apparatus of claim 21, wherein the ionized plasma jet is a continuous ionized plasma jet.

24. The apparatus of claim 21 wherein the ionized plasma jet includes more than one small jet near a bore entrance.

25. The apparatus of claim 24, wherein the more than one small jet is an annular jet.

26. An apparatus, comprising a laser configured to preferentially heat one side of debris thereby directing the debris out of an EUV light path external to an EUV discharge system, wherein the laser is configured to be triggered in coincidence with specific debris to be mitigated when a photon or particle detector detects emission of radiation or charged particles from the EUV discharge system.

27. The apparatus of claim 26, wherein the laser is a pulsed laser.

28. The apparatus of claim 26, wherein the laser is a continuous laser.

29. An apparatus, comprising
a nozzle configured to direct a liquid helium jet or liquid helium clusters across an EUV light path external to an EUV discharge system to block debris from entering the light path, wherein directing the liquid helium jet or liquid helium clusters is triggered to coincide with specific debris to be mitigated when a detector detects emission of radiation or charged particles from the EUV discharge system.

30. The apparatus of claim 29, wherein the liquid helium jet or liquid helium clusters include a pulsed jet.

31. The apparatus of claim 29, wherein the liquid helium jet or liquid helium clusters include a continuous ionized jet.

32. The apparatus of claim 29 wherein the liquid helium jet or liquid helium clusters include more than one small jet near a bore entrance.

33. The apparatus of claim 32, wherein the more than one small jet is an annular jet.

34. An apparatus for mitigating debris for an EUV discharge system, comprising:
a power supply, controller, and detector circuit configured to apply a pulsed DC bias to one or more locations external to an EUV light source along an EUV light path to coincide with specific debris to be mitigated when a photon or particle detector detects emission of radiation or charged particles from the EUV discharge system.

35. The apparatus of claim 34, further comprising one or more detectors to detect photons or electrons in the EUV light path configured for real-time detection of the photons or electrons to trigger application of the pulsed DC bias.

36. The apparatus of claim 35, wherein the detectors are grids, small plates, photodetectors, or current probes.

37. An apparatus for mitigating debris and providing fuel for a discharge in an EUV light source, comprising:
a differential pumping aperture (DPA); and
a gas curtain system configured to direct a gas curtain across an EUV light path of the EUV light source and wherein the gas curtain is positioned external to the EUV light source between the EUV source and EUV optics and wherein the EUV light source and the EUV optics are configured so that light emitted from the EUV light source passes through the DPA to the EUV optics, wherein the gas curtain is a jet composed of Xenon gas that is directed across an optical aperture of a discharge produced plasma (DPP) source.

38. The method of claim 37, wherein the gas curtain system includes a nozzle and a collector, both of which are mostly enclosed in a tube.

39. The apparatus of claim 38, wherein the tube is configured to leak a small amount of Xenon gas from the tube to both a DPP source region and a main chamber region.

40. The apparatus of claim 39, a pump configured to reduce a Xenon pressure in the main chamber region by pumping on the main chamber.

41. The apparatus of claim 40, wherein the pump is configured to maintain a DPP source region pressure at a desirable level by throttling a pump speed in the DPP source region.

42. The apparatus of claim 37 wherein the gas curtain system is configured to produce an ionized gas curtain to provide additional mitigation and DPA properties.

43. The apparatus of claim 37, wherein the DPA is biased to repel ions and electrons.

\* \* \* \* \*